(12) United States Patent
Gotou

(10) Patent No.: US 8,225,263 B2
(45) Date of Patent: Jul. 17, 2012

(54) METHOD OF SEMICONDUCTOR INTEGRATED CIRCUIT, RECORDING MEDIUM RECORDING DESIGN PROGRAM OF SEMICONDUCTOR INTEGRATED CIRCUIT, AND DESIGN SUPPORT APPARATUS OF SEMICONDUCTOR INTEGRATED CIRCUIT

(75) Inventor: Takashi Gotou, Tokyo (JP)

(73) Assignee: NEC Corporation, Tokyo (JP)

( * ) Notice: Subject to any disclaimer, the term of this patent is extended or adjusted under 35 U.S.C. 154(b) by 525 days.

(21) Appl. No.: 12/408,218

(22) Filed: Mar. 20, 2009

(65) Prior Publication Data

US 2009/0249275 A1 Oct. 1, 2009

(30) Foreign Application Priority Data

Mar. 25, 2008 (JP) ................................. 2008-077273

(51) Int. Cl.
  *G06F 17/50* (2006.01)
  *G06F 9/455* (2006.01)
  *G06F 11/22* (2006.01)
(52) U.S. Cl. .......................... 716/122; 716/111; 716/130
(58) Field of Classification Search .................... 716/52, 716/55, 111, 118–119, 122, 124–126, 130–131
  See application file for complete search history.

(56) References Cited

U.S. PATENT DOCUMENTS

| 6,574,786 | B1 * | 6/2003 | Pohlenz et al. | 716/112 |
|---|---|---|---|---|
| 6,591,406 | B2 * | 7/2003 | Ishikawa | 716/126 |
| 6,732,335 | B2 * | 5/2004 | Takabayashi et al. | 257/532 |
| 7,062,732 | B2 * | 6/2006 | Ito et al. | 716/55 |
| 7,284,214 | B2 * | 10/2007 | LeBritton et al. | 716/52 |
| 7,454,734 | B2 * | 11/2008 | Uchida | 716/119 |
| 2001/0042238 | A1 * | 11/2001 | Ishikawa | 716/10 |
| 2004/0139412 | A1 * | 7/2004 | Ito et al. | 716/8 |
| 2006/0090146 | A1 * | 4/2006 | LeBritton et al. | 716/4 |
| 2006/0236283 | A1 * | 10/2006 | Uchida | 716/10 |

FOREIGN PATENT DOCUMENTS

| JP | 2000138289 A | 5/2000 |
|---|---|---|
| JP | 2002288253 A | 10/2002 |
| JP | 2005276970 A | 10/2005 |
| JP | 2006049782 A | 2/2006 |

* cited by examiner

*Primary Examiner* — Stacy Whitmore

(57) ABSTRACT

A design method of a semiconductor integrated circuit carried out by a computer, including: a DRC step of performing a design rule check (Design Rule Check) with reference to layout information on an internal wiring in a capacitor cell and layout information on a signal wiring in the semiconductor integrated circuit; an integration step of integrating layout information on the internal wiring into layout information on the signal wiring when being determined in the DRC step that there is an error; and an elimination step of eliminating an error portion in the internal wiring from the integrated layout information.

15 Claims, 21 Drawing Sheets

203 CAPACITOR CELL INFORMATION

| CELL NAME | SIZE | UPPER-LIMIT NUMBER OF ELIMINATED WIRINGS | | SUBSTITUTION CELL NAME | CAPACITANCE AFTER ELIMINATION OF WIRINGS | | | |
|---|---|---|---|---|---|---|---|---|
| | | VDD | GND | | THE NUMBER OF ELIMINATED WIRINGS | | | |
| | | | | | 0 | 1 | 2 | 3 |
| C1 | 4 | 2 | 1 | D1 | 40 | 38 | 36 | 3 |
| C2 | 3 | 1 | 1 | D2 | 30 | 28 | 26 | 34 |
| C3 | 2 | 1 | 1 | D3 | 20 | 18 | 16 | |
| C4 | 1 | 0 | 0 | | | | | |

METHOD OF SEMICONDUCTOR INTEGRATED CIRCUIT, RECORDING MEDIUM RECORDING DESIGN PROGRAM OF SEMICONDUCTOR INTEGRATED CIRCUIT, AND DESIGN SUPPORT APPARATUS OF SEMICONDUCTOR INTEGRATED CIRCUIT

This application is based upon and claims the benefit of priority from Japanese Patent Application No. 2008-077273, filed on Mar. 25, 2008, the disclosure of which is incorporated herein in its entirety by reference.

TECHNICAL FIELD

The present invention relates to a design method for performing layout design of a semiconductor integrated circuit, a recording medium in which a design-program is recorded and a design support apparatus.

BACKGROUND ART

When a LSI (Large Scale Integrated Circuit) which operates in high-speed is designed using a fine processing technology, it is important to design a layout in consideration of noise which occurs in a wiring connecting power supply terminals (power supply line) of the LSI. In this case, it is effective to arrange a capacitor cell, which absorbs noise that occurs in a power supply line using the battery charging and discharging function that a capacitor have, in such a way that it is connected to the power supply line.

In LSI design, a capacitance value required to reduce noise which occurs in a power supply line is obtained using a power supply analysis tool based on a layout of a logic circuit. Then, a capacitor cell is inserted by a layout tool so that required capacitance may be filled. For example, in a layout design phase, a method to determine a capacitance value to be added to a semiconductor integrated circuit is disclosed in Japanese Patent Application Laid-Open No. 2002-288253 (patent document 1). In the method described in patent document 1, a power grid on a layout of an integrated circuit is divided into a plurality of areas, and a capacitance value which is required is determined for each area.

When a capacitor cell is arranged, in an area where density of arranged wiring is high, there is a case where an enough capacitor cell may not be able to be arranged because of interfering of a wiring in the capacitor cell and a wiring of a LSI already arranged. In such a case, there is a risk that backtracking such as layout change of the LSI is needed in order to reduce density of arranged wiring, and that a chip size is forced to increase for the purpose of such as securing an extra space around the area of arranged wiring.

For this reason, it is necessary to arrange a cell considering density of arranged wirings and wiring structure. In Japanese Patent Application Laid-Open No. 2006-49782 (patent document 2), a layout method which arranges an area pad cell and a wiring pattern cell based on wiring information and wiring structure is disclosed. As a result, a layout design that satisfies a design rule can be generated, while securing a connection between cells and a connection between a cell and other wiring patterns by a pin and a contact in a cell boundary area and an internal wiring area.

Meanwhile, a method in which interference with existing wirings is prevented by preparing a plurality of capacitor cells having different wiring patterns in advance and exchanging a capacitor cell according to a wiring situation of a LSI is conceivable (for example, refer to Japanese Patent Application Laid-Open No. 2005-276970 (patent document 3)).

However, in these related technologies, it is necessary to predict a wiring situation of a LSI to some extent, and, in some cases, to prepare many capacitor cells such as of the same size having a plurality of wiring patterns beforehand.

Moreover, it is disclosed in Japanese Patent Application Laid-Open No. 2000-138289 (patent document 4) that an internal wiring for unnecessary clock signals is eliminated to decrease parasitic capacitance. However, the technology described in this patent document 4 aims at speeding up and reduction in chip size of a LSI, and thus does not relate to noise reduction.

SUMMARY

An exemplary object of the invention is to arrange a capacitor cell according to a capacitance value required for noise reduction in a semiconductor integrated circuit without preparing many kinds of capacitor cells.

A design method of semiconductor integrated circuit according to an exemplary aspect of the invention includes: a DRC step of performing a design rule check (Design Rule Check) with reference to layout information on an internal wiring in a capacitor cell and layout information on a signal wiring in the semiconductor integrated circuit; an integration step of integrating layout information on the internal wiring into layout information on the signal wiring when being determined in the DRC step that there is an error; and an elimination step of eliminating an error portion in the internal wiring from the integrated layout information.

A recording medium according to an exemplary aspect of the invention includes: the design program which makes a computer execute the design method of a semiconductor integrated circuit described in the design method.

A design support apparatus of a semiconductor integrated circuit according to an exemplary aspect of the invention includes: a DRC unit that performs a design rule check (DRC) with reference to layout information on an internal wiring in a capacitor cell and layout information on a signal wiring in a semiconductor integrated circuit of a design object; and a correction unit that integrates layout information on the internal wiring into layout information on the signal wiring when the DRC unit determines that there is an error, wherein the correction unit eliminates an error portion in the internal wiring from the integrated layout information.

BRIEF DESCRIPTION OF THE DRAWINGS

Exemplary features and advantages of the present invention will become apparent from the following detailed description when taken with the accompanying drawings in which.

EXEMPLARY EMBODIMENT

Exemplary embodiments of the present invention will now be described in detail in accordance with the accompanying drawings.

Figure 1:
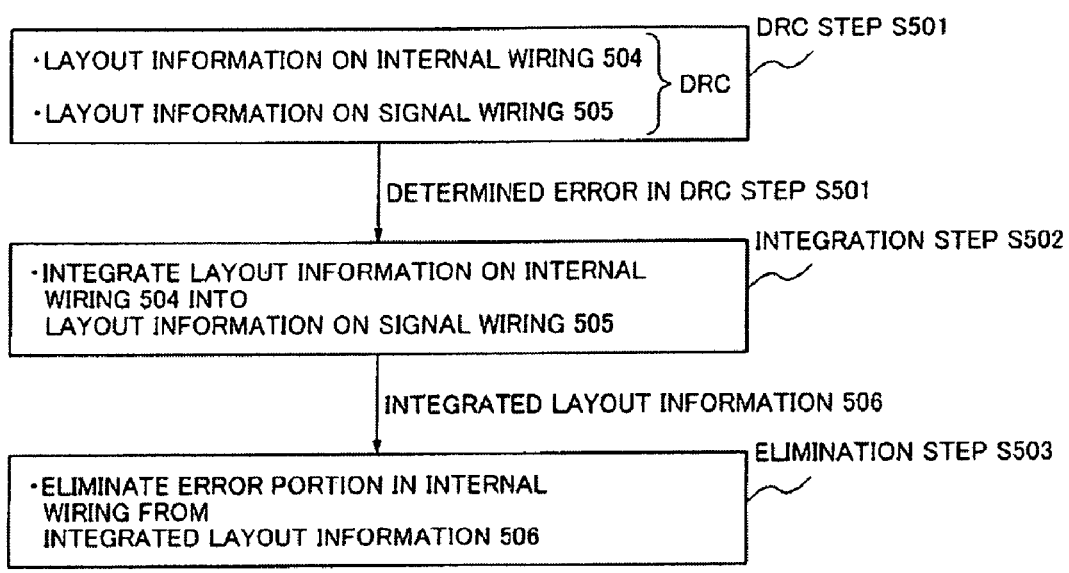
FIG. 1 is a diagram showing a design method of a semiconductor integrated circuit according to the first exemplary embodiment of the present invention.

Hereinafter, a design method of a semiconductor integrated circuit of the first exemplary embodiment of the present invention will be described with reference to FIG. 1. FIG. 1 is a diagram showing a design method of a semiconductor integrated circuit according to the first exemplary embodiment of the present invention.

The first exemplary embodiment relates to a design method of a semiconductor integrated circuit carried out by a computer. This design method of a semiconductor integrated circuit includes DRC step 501, integration step 502 and elimination step 503.

The DRC step 501 is a step in which a design rule check (DRC) is performed with reference to layout information on internal wiring 504 in a capacitor cell and layout information on signal wiring 505 in the semiconductor integrated circuit.

When being determined that there is an error in the DRC step 501, the layout information of internal wiring 504 is integrated into the layout information of the signal wiring 505 in the integration step 502.

The elimination step 503 is for eliminating an error portion in the internal wiring from integrated layout information 506 which is generated by the above-mentioned integration.

Thus, according to the first exemplary embodiment, there is an effect that a capacitance necessary for noise reduction can be added to a semiconductor integrated circuit without preparing many kinds of capacitor cells.

Next, the second exemplary embodiment of the present invention will be described with reference to accompanying drawings. In the drawings, an identical or similar reference mark indicates an identical, similar or equivalent component.

(Composition of Design Support Apparatus)

Figure 2:
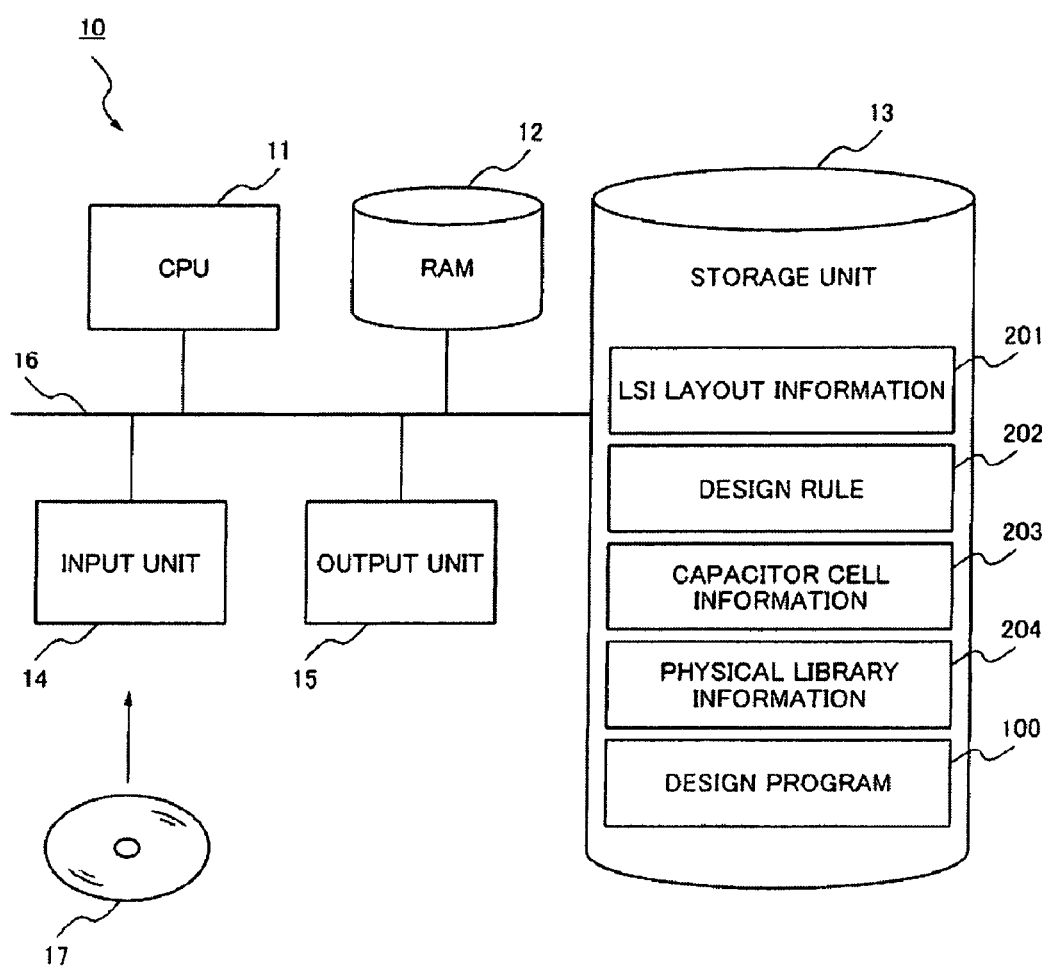
FIG. 2 is a diagram showing the configuration of a design support apparatus of a semiconductor integrated circuit according to the second exemplary embodiment of the present invention.

The configuration in the embodiment of a design support apparatus 10 of a semiconductor integrated circuit according to the second exemplary embodiment will be described with reference to FIGS. 2 to 12 and FIG. 14. FIG. 2 is a diagram showing the configuration of a design support apparatus of a semiconductor integrated circuit according to the second exemplary embodiment of the present invention. The design support apparatus 10 includes a CPU (Central Processing Unit) 11, a RAM (Random Access Memory) 12, a storage unit 13, an input unit 14 and an output unit 15 which are connected mutually via a bus 16. The storage unit 13 is an external storage device such as a hard disk and a memory. The input unit 14 such as a keyboard and a mouse outputs various data to the CPU 11 and the storage 13 by being operated by a user. Moreover, the input unit 14 has a reading device which reads data of a recording medium 17 in which a design program 100 of the second exemplary embodiment is recorded. The output unit 15 outputs a layout result of a semiconductor device, which is illustrated on a monitor or a printer and outputted from the CPU 11, in a manner visually recognizable to a user.

The storage unit 13 stores LSI (Large Scale Integrated Circuit) layout information 201, design rule 202, capacitor cell information 203, physical library information 204 and design program 100. In response to input from the input unit 14, the CPU 11 carries out the design program 100 in the storage unit 13 and performs layout processing of a cell and change (correction) processing of a layout. On this occasion, various data and programs from the storage unit 13 is stored in the RAM 12 temporarily, and the CPU 11 performs various processing using data in the RAM 12. Meanwhile, the design program 100 is read by the input unit 14 from the recording medium 17 and stored in the storage unit 13. The recording medium 17 is a computer-readable recording medium such as a hard disk, an optical disc, a magneto-laser disk, a CD (Compact Disk), a DVD (Digital Versatile Disk) and a non-volatile memory card.

Figure 14:
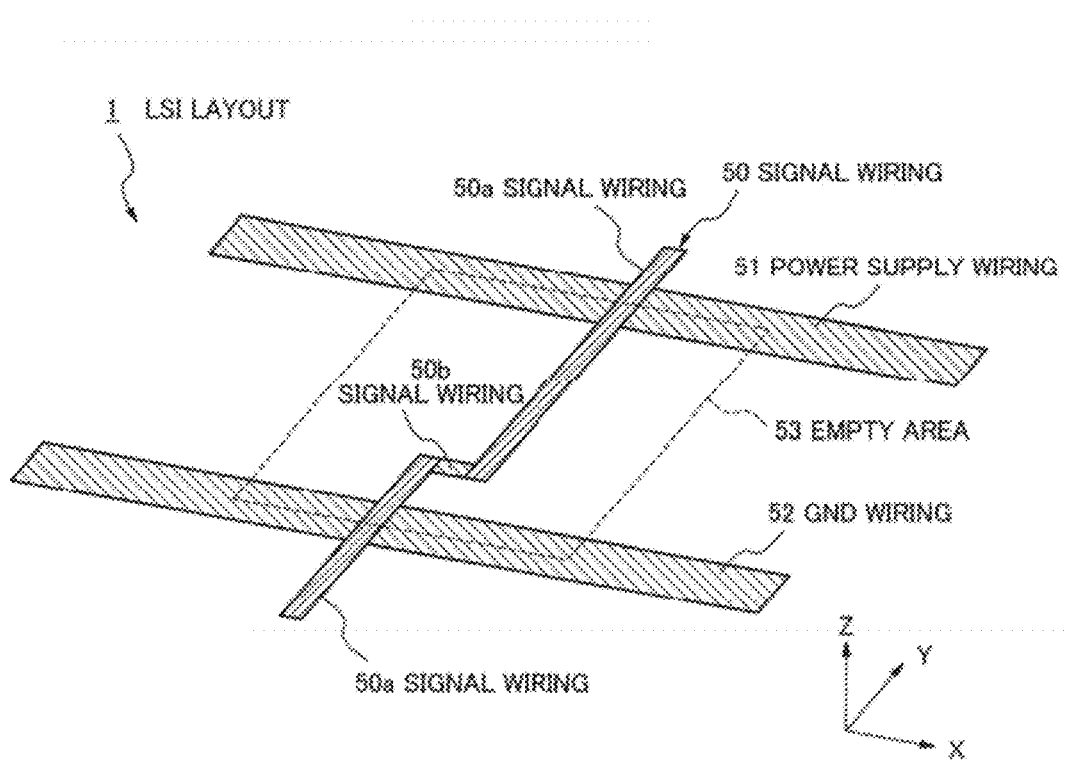
FIG. 14 is a conceptual diagram showing an example of a layout structure of LSI wiring and an example of an empty area according to the second exemplary embodiment.

The LSI layout information 201 is information which indicates a layout of a LSI for which logic circuits have been arranged in a layout phase. The LSI layout information 201 includes information about wiring structure (a layout coordinate, for example) of a LSI wiring 1 (signal wiring 50, power supply wiring 51 and GND (Ground) wiring 52) such as shown in FIG. 14, and information about arrangement structure (the position of a cell, for example) of a macrocell arranged in the LSI.

The design rule 202 is a capacitance value (a capacitance value) required to a semiconductor integrated circuit (LSI) which is a design object, and information for calculating that.

Figure 3:
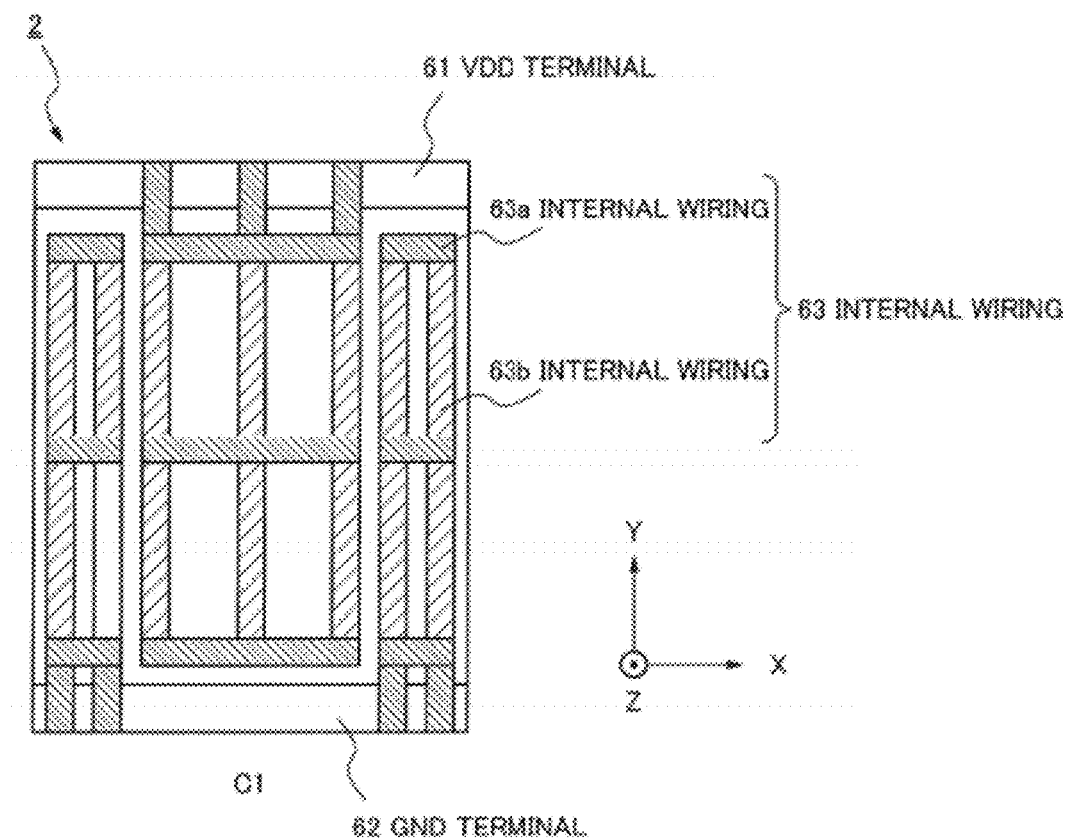
FIG. 3 is a plan view showing an example of a layout of a capacitor cell according to the second exemplary embodiment.
Figure 4A:
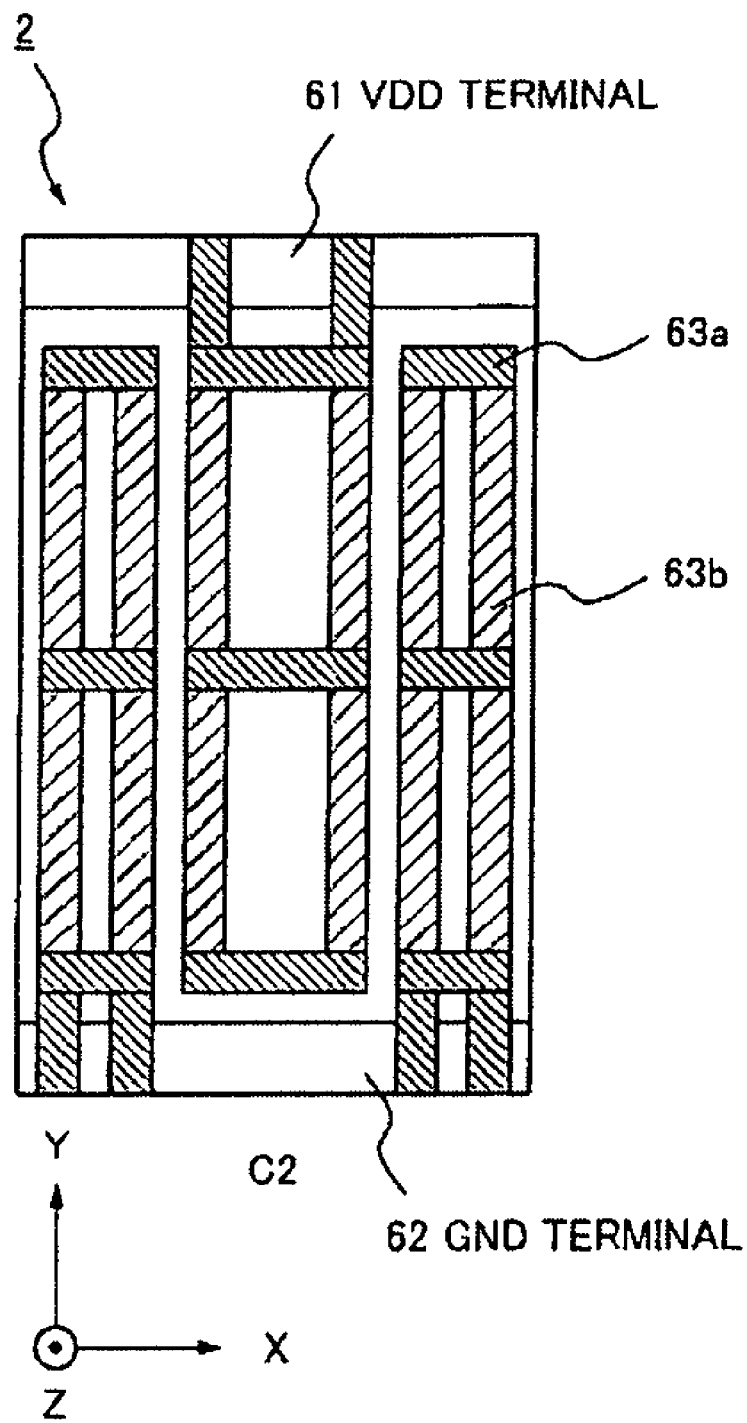
FIG. 4A is a plan view showing an example of a layout of a capacitor cell according to the second exemplary embodiment.
Figure 4B:
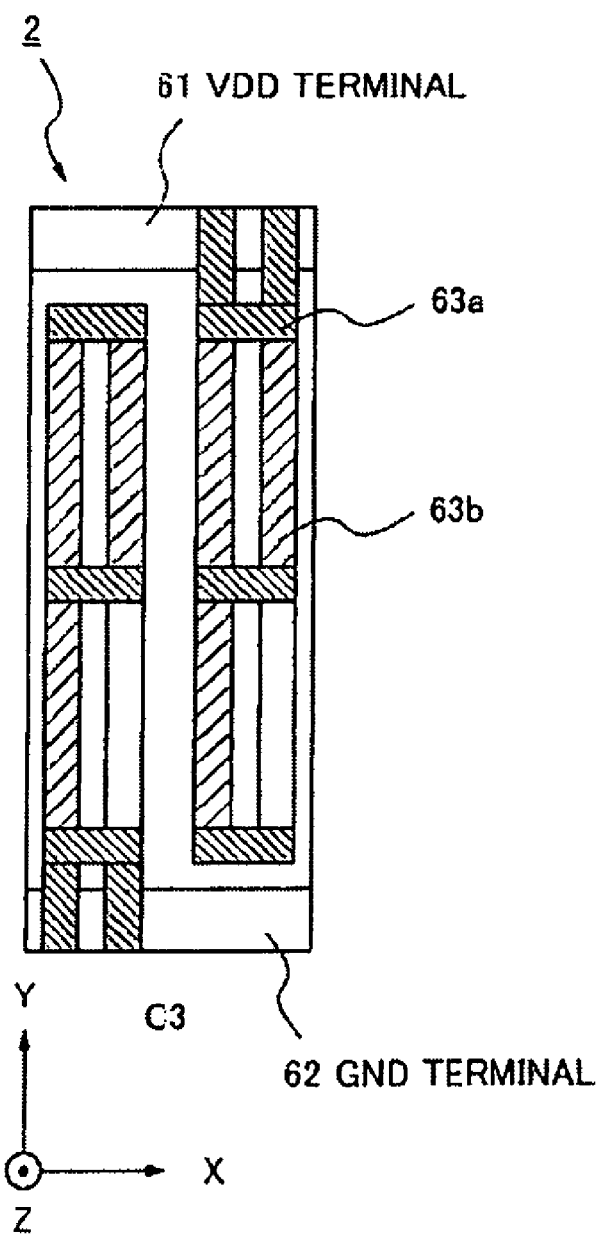
FIG. 4B is a plan view showing a different example of a layout of a capacitor cell according to the second exemplary embodiment.
Figure 4C:
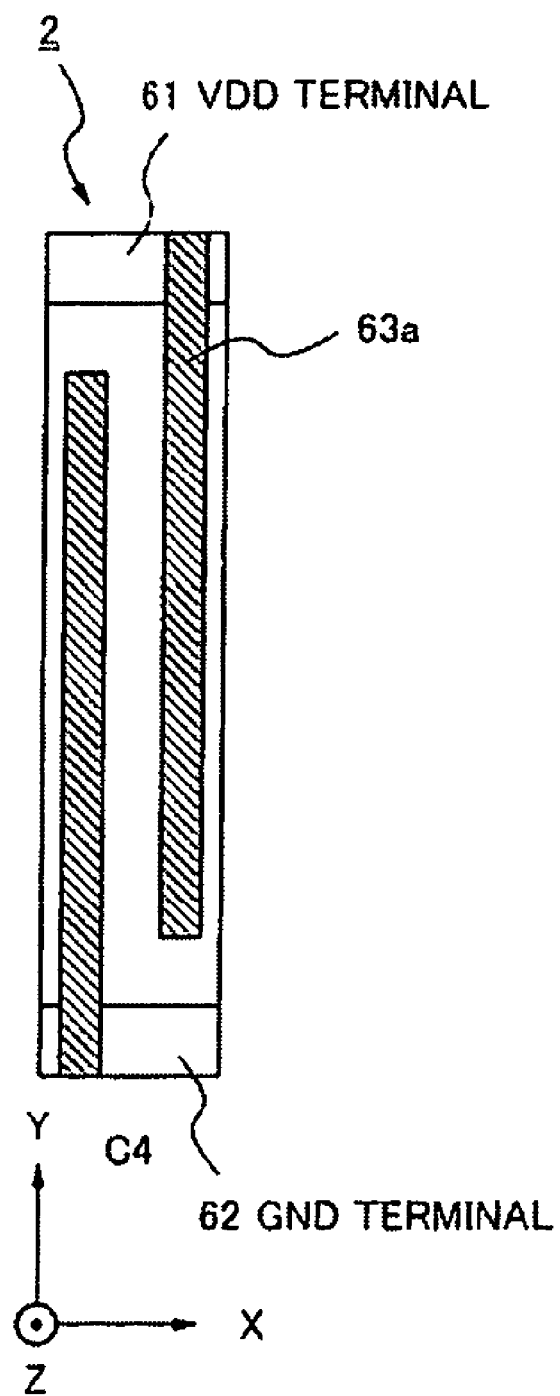
FIG. 4C is a plan view showing a different example of a layout of a capacitor cell according to the second exemplary embodiment.

The physical library information 204 includes information about a layout of a capacitor cell 2. An example of a layout of capacitor cell 2 is shown in FIG. 3. For simplicity, description about components besides the metal layer is omitted here. With reference to FIG. 3, capacitor cell 2 has a VDD (Voltage Common Drain FET) (power supply) terminal 61 which is connected to a gate (not illustrated) of a transistor arranged in the cell and a GND (grounding) terminal 62 which is connected to a drain (diffusion layer) which is not illustrated. The VDD terminal 61 is connected to a gate provided in a lower layer in Z-direction via a metal wiring (internal wiring 63) arranged in the same layer (XY plane) and a contact which is not illustrated. The GND terminal 62 is connected to a drain provided in a lower layer in Z-direction via a metal wiring (internal wiring 63) arranged in the same layer (XY plane) and a contact which is not illustrated. By such a configuration, capacitor cell 2 has wiring capacitance of a fixed quantity determined uniquely by the width and the length of internal wiring 63.

In the second exemplary embodiment, when capacitor cell 2 is arranged in a LSI, there is a case where a internal wiring in the capacitor cell 2 is eliminated. However, internal wiring 63 has an internal wiring 63a by which the function as a capacitor cell (a capacitance value no smaller than a predetermined amount) is lost if it is eliminated from the capacitor cell 2. In the physical library information 204, it is prescribed that elimination of such internal wiring 63a be prohibited. Capacitor cell 2 may possess an internal wiring 63b by which, even if the capacitor cell 2 is eliminated, a capacitance value no smaller than a predetermined amount is secured (the function as a capacitor cell is not lost) although a capacitance value is reduced. In this case, information which prescribes which wiring is internal wiring 63b which can be eliminated is included in the physical library information 204.

Preferably, the physical library information 204 including a plurality of capacitor cell 2s of different cell sizes and capacitance values is prepared. For example, capacitor cell 2 (C1) shown in FIG. 3 and capacitor cell 2s (C2, C3 and C4) of different cell sizes and capacitance values are prepared (refer to FIG. 4A, FIG. 4B and FIG. 4C. The capacitance values of the capacitor cell indicated in this example decrease in order of C1, C2, C3 and C4. The number of the internal wiring 63bs that can be eliminated decreases in the order of C1, C2 and C3, and capacitor cell C4 does not include internal wiring 63b that can be eliminated.

Figure 5:
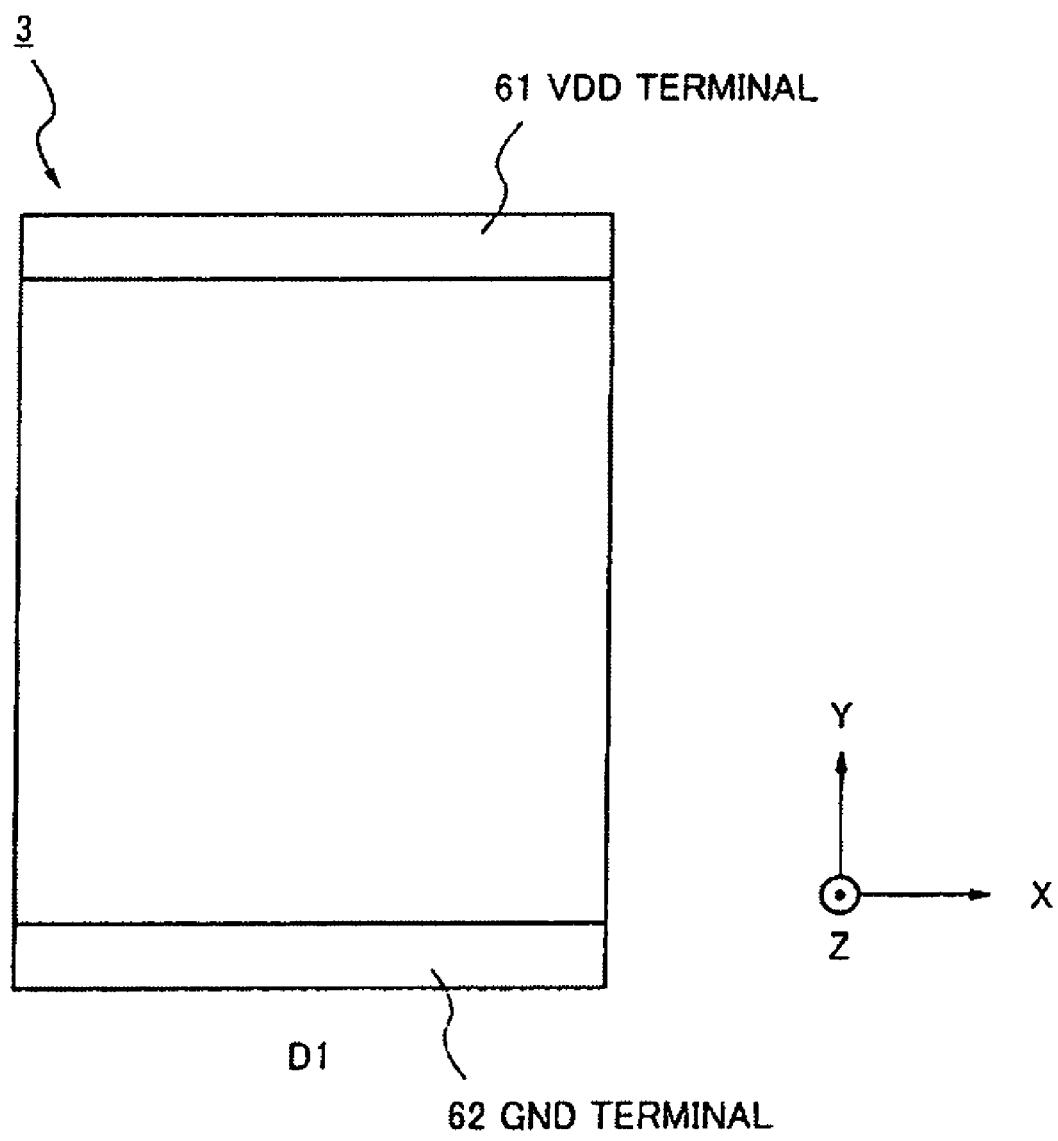
FIG. 5 is a plan view showing an example of a layout of a substitution cell according to the second exemplary embodiment.
Figure 6A:
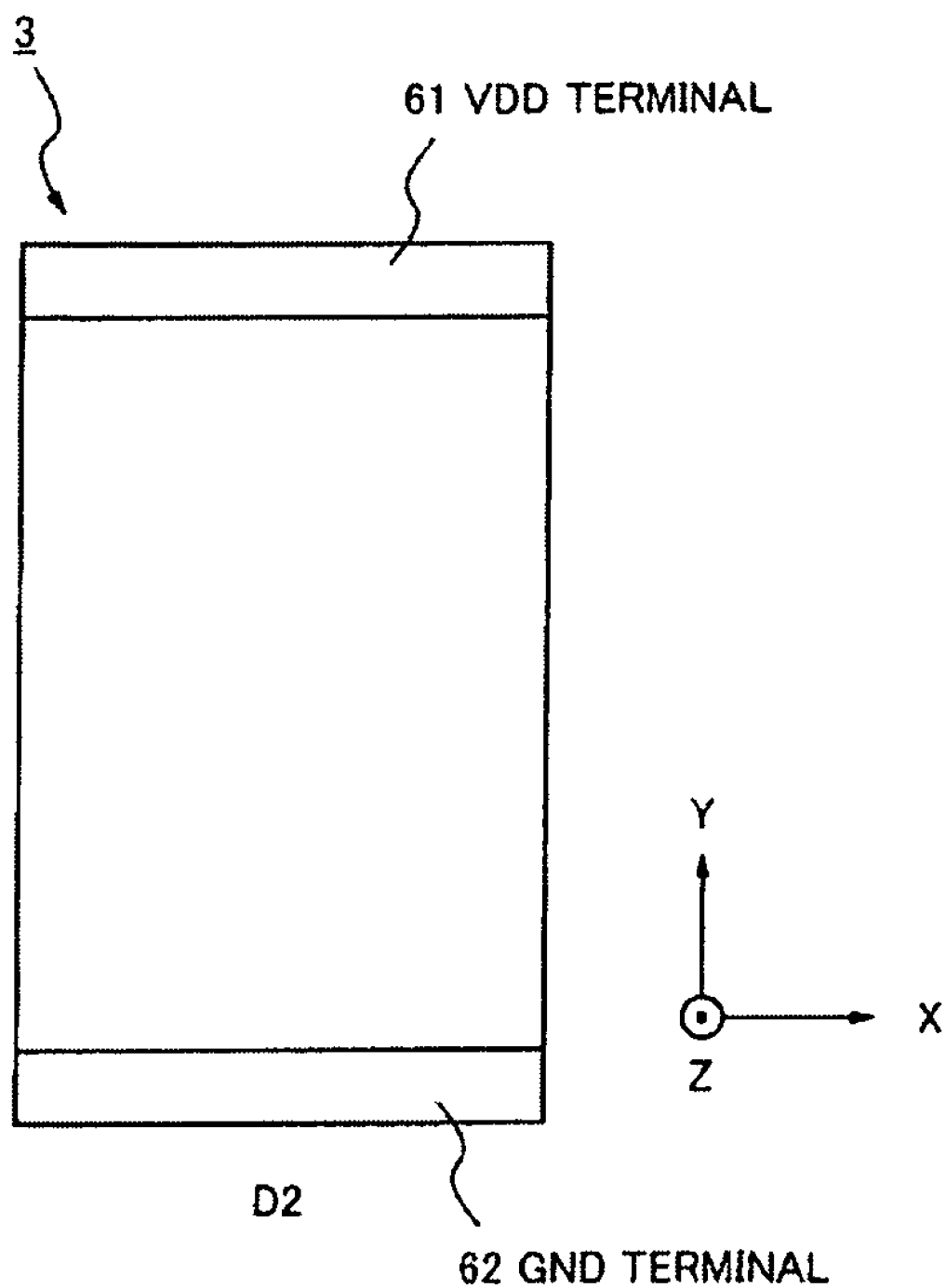
FIG. 6A is a plan view showing an example of a layout of a substitution cell according to the second exemplary embodiment.
Figure 6B:
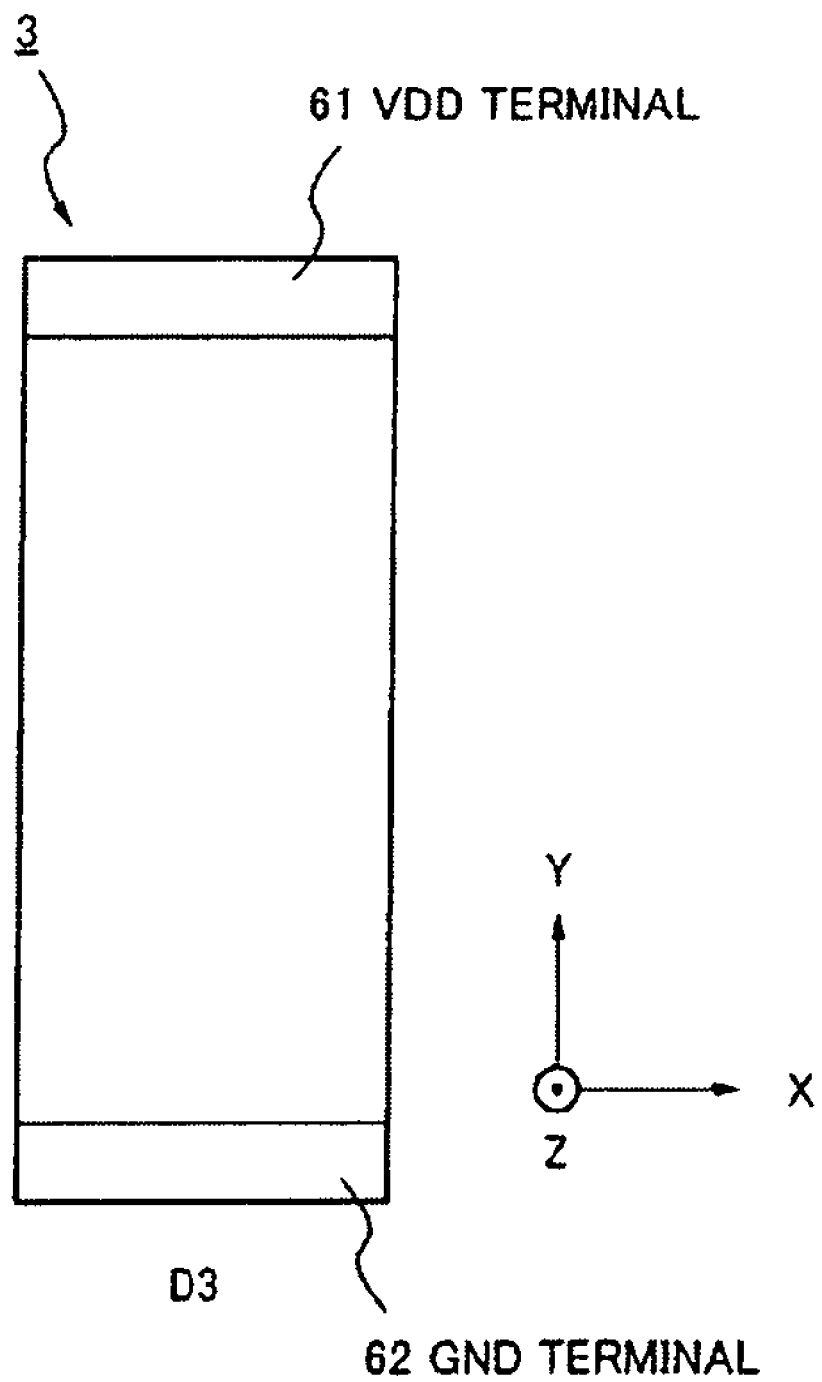
FIG. 6B is a plan view showing a different example of a layout of a substitution cell according to the second exemplary embodiment.

The physical library information 204 includes further information about a layout of a substitution cell 3. Substitution cell 3 is a cell having the same size and terminals with corresponding capacitor cell 2, with the exception that the former does not have internal wiring 63. When capacitor cell 2 is designed, it is preferable that substitution cell 3 is created corresponding to the capacitor cell 2. FIG. 5 is a diagram showing a layout of substitution cell 3 (D1) created corresponding to capacitor cell 2 (C1) shown in FIG. 3. A layout of substitution cell 3 (D1) is generated by eliminating internal wiring 63 from a layout of capacitor cell 2 (C1).

Substitution cell 3 is prepared corresponding to capacitor cell 2 having internal wiring 63b that can be eliminated. That is, substitution cell 3 corresponding to capacitor cell 2 in which internal wiring 63b that can be eliminated is not provided (capacitor cell 2 (C4), for example) is not prepared. For this reason, in this example, substitution cell 3s (D2 and D3) corresponding to capacitor cell 2s (C2 and C3) in addition to substitution cell 3 (D1) shown in FIG. 5 are prepared (refer to FIG. 6A and FIG. 6B).

Figure 7:
FIG. 7 is a diagram showing information included in capacitor cell information according to the second exemplary embodiment.

The capacitor cell information 203 includes information which specifies a cell size and a capacitance value of capacitor cell 2 and a corresponding relationship between capacitor cell 2 and substitution cell 3. FIG. 7 is a diagram showing information included in the capacitor cell information 203. With reference to FIG. 7, a cell size for each of prepared capacitor cell 2 and a corresponding substitution cell name are set to the capacitor cell information 203. For example, in the capacitor cell information 203, it is set about capacitor cell 2 (C1) that the cell size is "4" and the corresponding substitution cell 3 is "D1".

Again with reference to FIG. 7, there is a column "Upper-limit number of eliminated wirings" which is categorized into two categories (that is, a category of "VDD" that indicates internal wirings connecting with the VDD terminal 61 and a category of "GND" that indicates internal wirings connecting with the GND terminal 62). For each of the internal wiring categories, an upper limit value of the number of internal wirings that can be eliminated is set in the capacitor cell information 203. The upper limit value is determined from a viewpoint of such as, at the time of design of capacitor cell (at the time of creation of a physical library information 204), the design is performed such that there is no influence of the frequency characteristic of the capacitor cell itself (time required to battery charging and discharging) and that there are no internal wirings which do not connect with the VDD terminal 61 or the GND terminal 62 (float wirings). With reference to FIG. 7, in the capacitor cell information 203, it is set for capacitor cell 2 (C1) that the upper limit number of internal wirings that can be eliminated among the internal wiring 63bs connecting with the VDD terminal 61 is "2", and the upper limit number of internal wirings that can be eliminated among the internal wiring 63bs connecting with the GND terminal 62 is "1", for example.

Moreover, a capacitance value when eliminating some of internal wiring 63bs from capacitor cell 2 is set to the capacitor cell information 203 for each of the number of eliminated wirings. For example, it is recorded in the capacitor cell information 203 that the capacitance value is 40 [pF] when none of the internal wiring 63bs are eliminated from capacitor cell 2 (C1), 38 [pF] when one of the internal wiring 63bs eliminated, 36 [pF] when two of the internal wiring 63bs eliminated, and 34 [pF] when three of the internal wiring 63bs eliminated.

Figure 8:
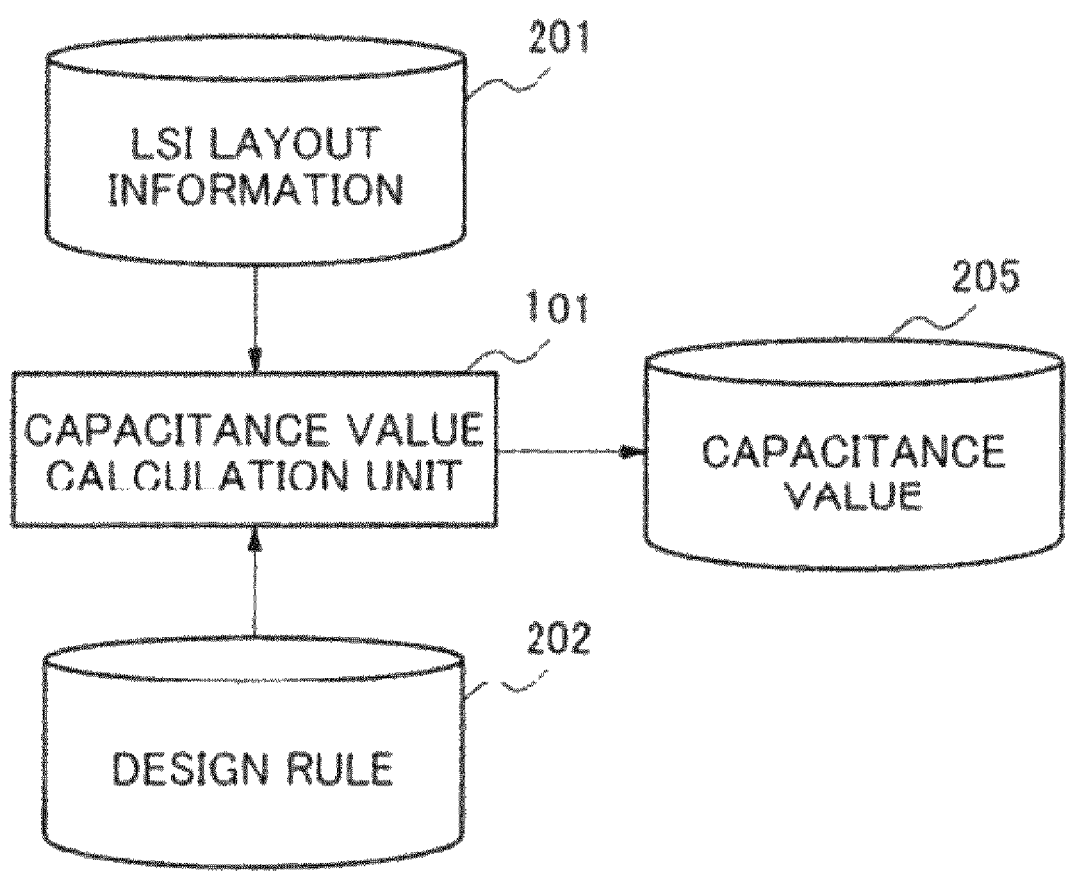
FIG. 8 is a diagram showing the configuration of a design support apparatus when calculating a capacitance value.
Figure 9:
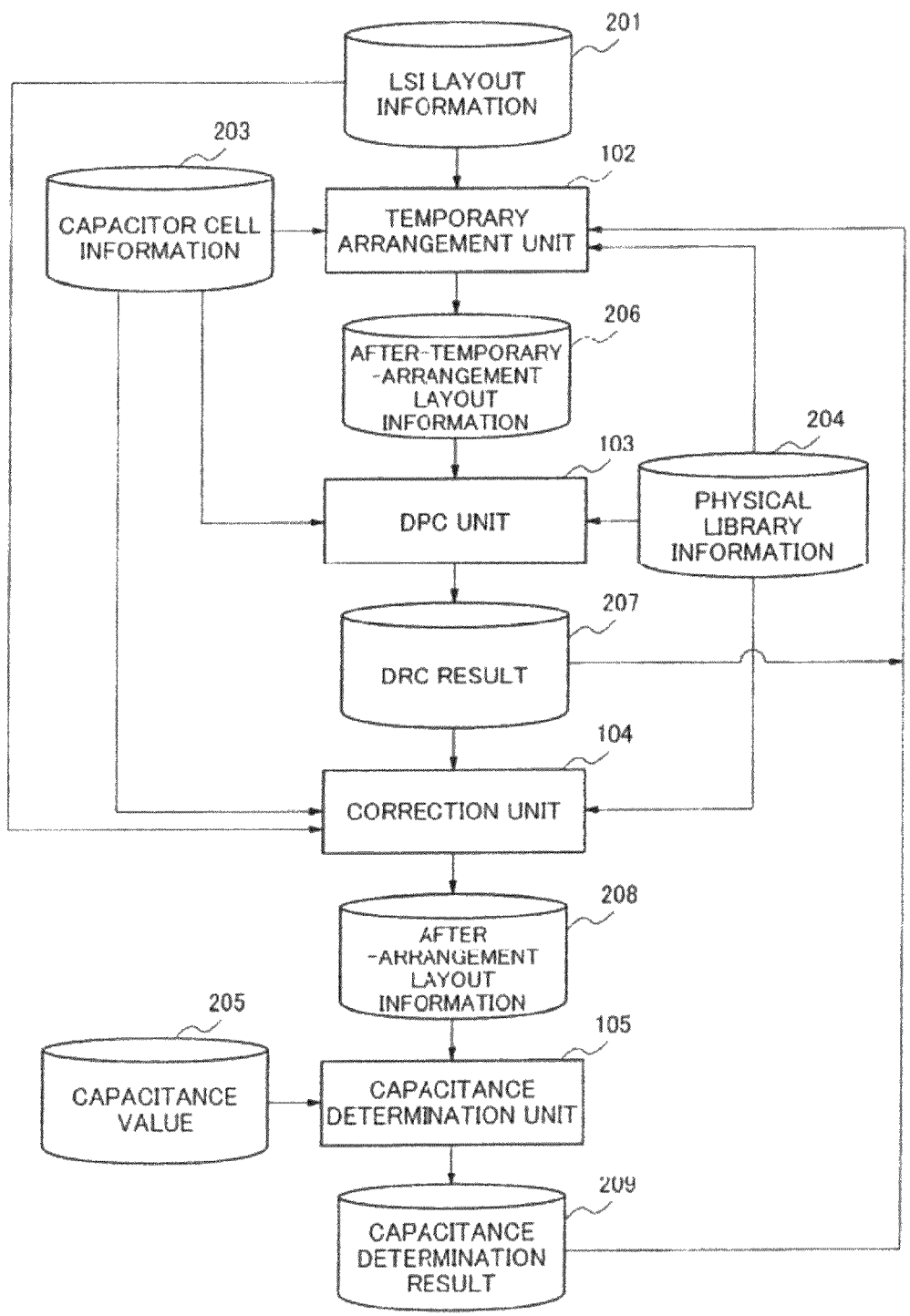
FIG. 9 is a diagram showing the configuration of a design support apparatus when adding capacitance.

The design program 100 realizes each function of a capacitance value calculation unit 101 shown in FIG. 8 and a temporary arrangement unit 102, a DRC (Design Rule Check) unit 103, a correction unit 104 and a capacitance determination unit 105 shown in FIG. 9 by being carried out by the CPU 11. With reference to FIG. 8, the capacitance value calculation unit 101 refers to the LSI layout information 201 and the design rule 202 to calculate a capacitance value (the capacitance value 205) required for noise reduction in a LSI of a design object. Regarding a calculation method of a capacitance value 205, a capacitance value (the capacitance value 205) required for noise reduction is calculated for each area, which is decided by distance between power supply wirings (power grid) passing in the LSI vertically and horizontally or the like, using technique shown by related technology such as on patent document 1.

Figure 10:
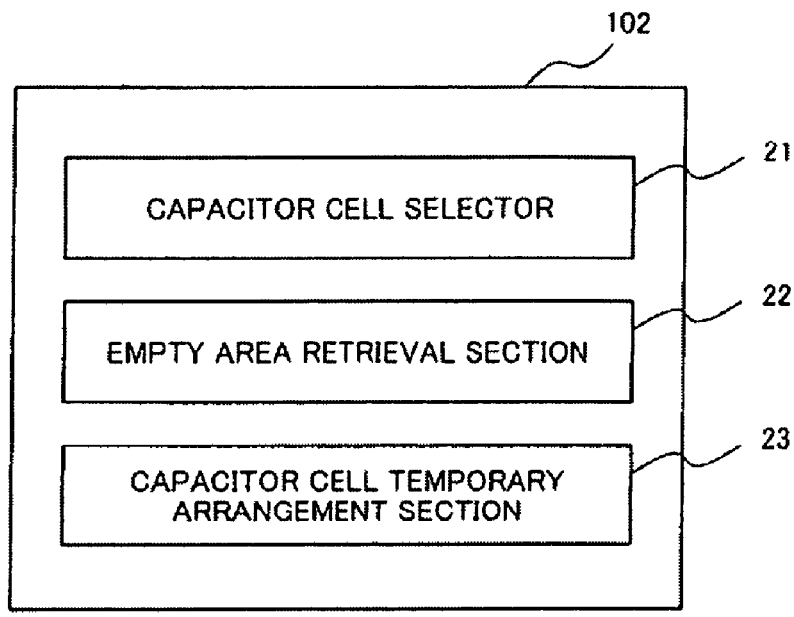
FIG. 10 is a functional block diagram showing the configuration of a temporary arrangement unit according to the second exemplary embodiment.

With reference to FIG. 9, a temporary arrangement unit 102 selects capacitor cell 2 from the physical library information 204 based on the capacitor cell information 203, a DRC result 207 and a capacitance determination result 209 and performs temporary arrangement of the capacitor cell 2 on the LSI. FIG. 10 is a functional block diagram showing the function of the temporary arrangement unit 102. With reference to FIG. 10, the temporary arrangement unit 102 includes a capacitor cell selector 21, an empty area retrieval section 22 and a capacitor cell temporary arrangement section 23. The capacitor cell selector 21 refers to the capacitor cell information 203 and selects capacitor cell 2 in descending order of the cell size (cell capacitance). The empty area retrieval section 22 refers to the LSI layout information 201 and searches for an empty area 53 on the LSI where the capacitor cell 2 selected by the capacitor cell selector 21 can be arranged. In this case, when there is no empty area 53 on the LSI, the capacitor cell selector 21 selects capacitor cell 2 of a next largest cell size. On the other hand, when empty area 53 where the capacitor cell 2 can be arranged has been found, the capacitor cell temporary arrangement section 23 performs temporary arrangement of the selected capacitor cell 2 in the empty area 53 found. In this case, the capacitor cell temporary arrangement section 23 performs temporary arrangement using the LSI layout information 201 and layout information on the capacitor cell 2 extracted from the physical library information 204. Layout information on the LSI for which temporary arrangement of the capacitor cell 2 has been performed is outputted from the temporary arrangement unit 102 as after-temporary-arrangement layout information 206.

When the inputted DRC result 207 shows that there is a DRC error in internal wiring 63a which is a wiring that cannot be eliminated or that the number of wirings that can be eliminated is larger than or equal to a specified value, the empty area retrieval section 22 searches for another empty area where the capacitor cell 2 can be arranged. Or, when the capacitance determination result 209 shows that a capacitance value by the inserted capacitor cell 2 does not fill a capacitance value required for noise reduction, the empty area retrieval section 22 searches for another empty area where the capacitor cell 2 can be arranged.

Figure 11:
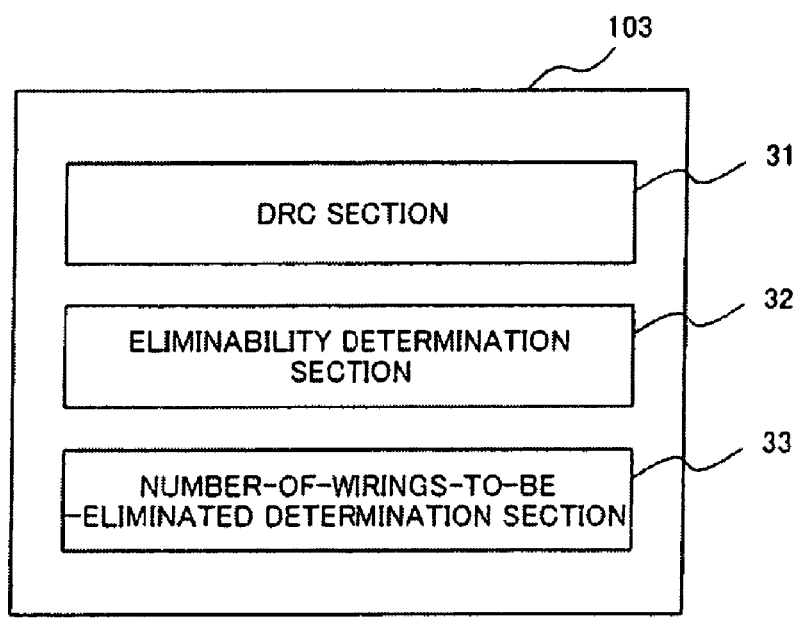
FIG. 11 is a functional block diagram showing the configuration of a DRC unit according to the second exemplary embodiment.

A DRC unit 103 investigates whether terminals and internal wiring 63 in the capacitor cell 2 which has been arranged temporarily by the temporary arrangement unit 102 have a DRC error such as a short circuit and a spacing error (minimum space violation) with signal wiring 10 or the like in the LSI. When there is a DRC error, the DRC unit 103 determines whether there is any internal wiring 63 which can be eliminated further. FIG. 11 is a functional block diagram showing the function of the DRC unit 103. With reference to FIG. 11, the DRC unit 103 includes a DRC section 31, an eliminability determination section 32 and a number-of-wirings-to-be-eliminated determination section 33. The DRC section 31 refers to the after-temporary-arrangement layout information 206 to perform DRC (design rule check) for a crossing and a separation between VDD terminal 61, GND terminal 62 and internal wiring 63 and signal wiring 10 installed in the same wiring layer as these. The eliminability determination section 32 determines whether an internal wiring having a DRC error can be eliminated or not based on information which indicates a DRC error portion and the physical library information 204. The number-of-wirings-to-be-eliminated determination section 33 compares the number of wirings causing a DRC error and the number of wirings which can be eliminated specified by the capacitor cell information 203 based on information indicating a DRC error portion and the capacitor cell information 203 to determine the number of internal wirings to be eliminated. The DRC unit 103 outputs information which shows whether there is a DRC error or not, information which indicates whether internal wiring can be eliminated or not and information which indicates the number of internal wirings which can be eliminated when the internal wirings can be eliminated, as a DRC result 107.

Figure 12:
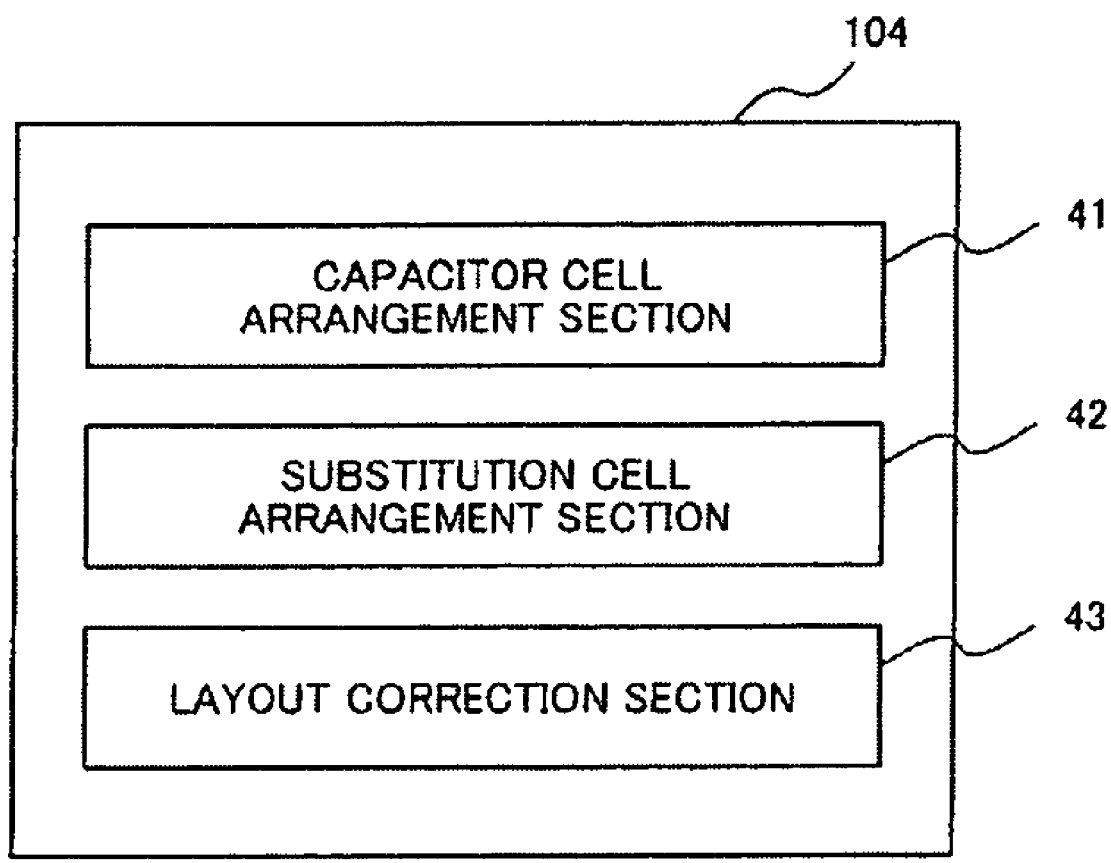
FIG. 12 is a functional block diagram showing the configuration of a correction unit according to the second exemplary embodiment.

The correction unit 104 arranges a cell based on the DRC result 107 in the empty area 53 and corrects a layout of the LSI if needed. FIG. 12 is a functional block diagram showing the function of the correction unit 104. With reference to FIG. 12, the correction unit 104 includes a capacitor cell arrangement section 41, a substitution cell arrangement section 42 and a layout correction section 43. The correction unit 104 arranges capacitor cell 2 for which temporary arrangement has been performed in empty area 53 and updates the LSI layout information 201 according to the DRC result 207 which shows that a DRC error is not detected. The substitution cell arrangement section 42 extracts substitution cell 3 corresponding to the capacitor cell 2 from the physical library information 204 and arranges it in the empty area 53 according to the DRC result 207 which shows that a DRC error is detected and that the number of wirings which can be eliminated is less than or equal to a specified number. The layout correction section 43 integrates (merges) internal wiring 63 of the capacitor cell 2 into the LSI layout information 201 according to the DRC result 207 that shows that a DRC error is detected and the number of wirings that can be eliminated is less than or equal to a specified number. Also, after arrangement of substitution cell 3, the layout correction section 43 eliminates a wiring element corresponding to internal wiring 63b that is a DRC error portion and updates the LSI layout information 201. The correction unit 104 outputs the LSI layout information 201 updated by layout correction or addition of capacitor cell 2 as after-arrangement layout information 208.

The capacitance determination unit 105 refers to the after-arrangement layout information 208, and determines whether an additional capacitance value which is calculated by totaling the capacitance value s according to the added capacitor cell 2 and the corrected layout is larger than the capacitance value 205 required for noise reduction calculated in advance. The capacitance determination unit 105 outputs a capacitance determination result 209 which indicates whether the additional capacitance value fills the capacitance value 205 or not.

Further, it is preferable that each of the LSI layout information 201, the design rule 202, the capacitor cell information 203, the physical library information 204, the capacitance value 205, the after-temporary-arrangement layout information 206, the DRC result 207, the after-arrangement layout information 208 and the capacitance determination result 209 is outputted from the output unit 15 visually recognizably. A designer (user) can obtain a design guideline by various kinds of information outputted from (displayed on) the output unit 15.

(Operation of Design Support Apparatus)

Figure 13:
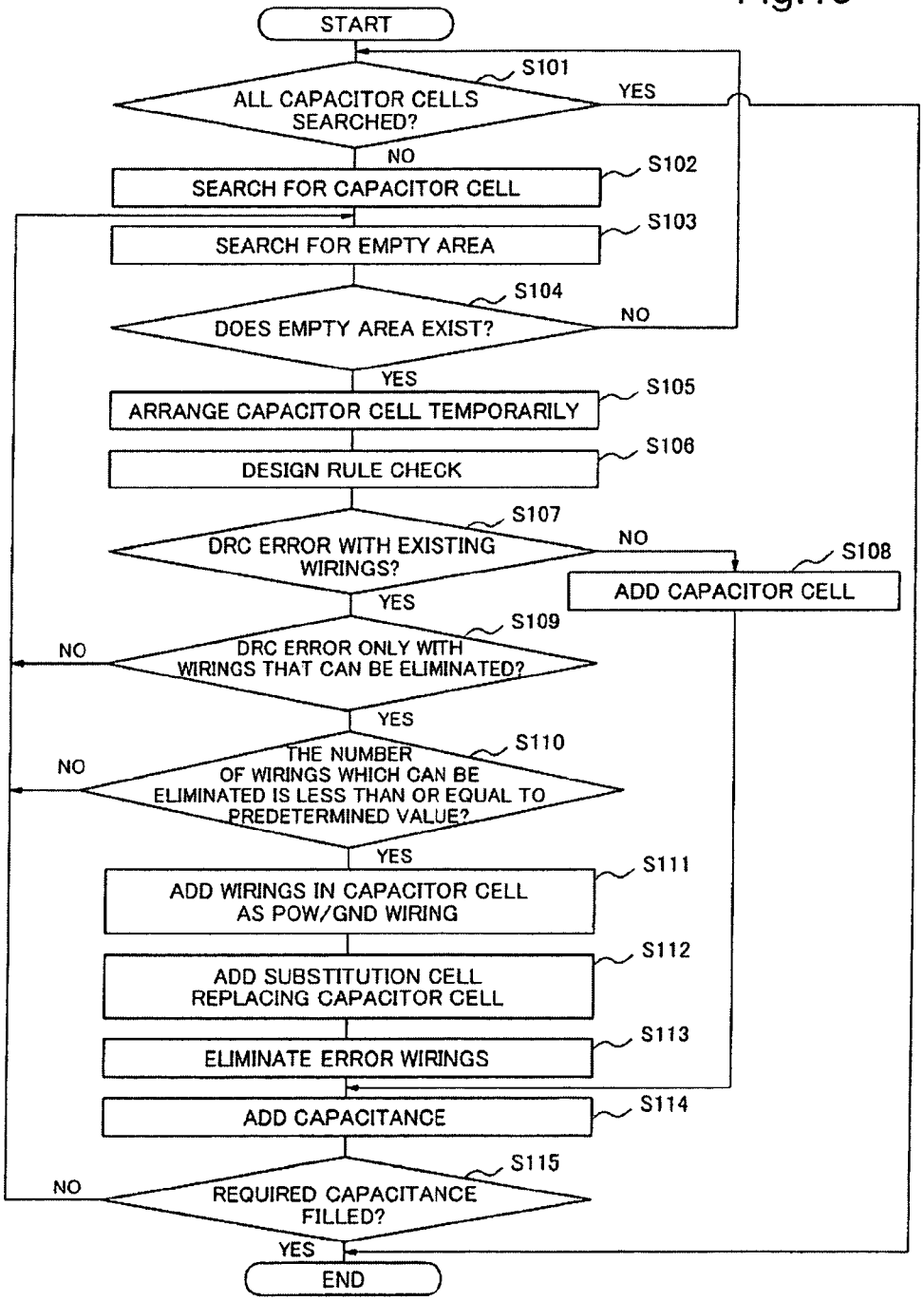
FIG. 13 is a flow chart showing operation in an embodiment of a design support apparatus according to the second exemplary embodiment.

Next, details of operation of the design support apparatus 10 according to the second exemplary embodiment will be described with reference to FIGS. 13 to 19. FIG. 13 is a flow chart showing operation of the design support apparatus 10 according to the second exemplary embodiment. FIGS. 14 to 19 are conceptual diagrams showing state transition regarding LSI layout correction in each stage of the flow shown in FIG. 13. Operation which adds capacitance of the predetermined amount required for noise reduction to a LSI after a layout design will be described below. Here, it is assumed that the capacitance value 205 that is a capacitance value required for noise reduction is calculated in advance by the design support apparatus 10.

First, when the LSI layout information 201, the capacitor cell information 203 and the physical library information 204 of a LSI layout 1 after wiring design are inputted, the temporary arrangement unit 102 selects capacitor cell 2 of the largest cell size among capacitor cell 2s which have not been selected yet based on the capacitor cell information 203 (Steps S101 and S102). In the case where the above-mentioned capacitor cell 2s (C1, C2, C3 and C4) are prepared, capacitor cell 2 of the largest cell size (C1) is selected first.

Next, the temporary arrangement unit 102 refers to the LSI layout information 201 to search for empty area 53 in which the selected capacitor cell 2 can be arranged (Step S103). In that time, when empty area 53 in which the capacitor cell 2 can be arranged is not found, processing moves to Step S101 (NO at Step S104). If information about capacitor cell 2s which have not been selected yet is recorded in the capacitor cell information 203 (NO at Step S101), the temporary arrangement unit 102 selects capacitor cell 2 of the next largest cell size (Step S102). For example, when capacitor cell 2 (C1) has been already selected, and capacitor cell 2s (C2, C3 and C4) have not been selected yet, capacitor cell 2 (C2) that has the next largest cell size is selected. On the other hand, when all capacitor cells recorded in the capacitor cell information 203 have been already selected, processing of adding capacitance to the LSI is ended (YES at Step S101).

Figure 15:
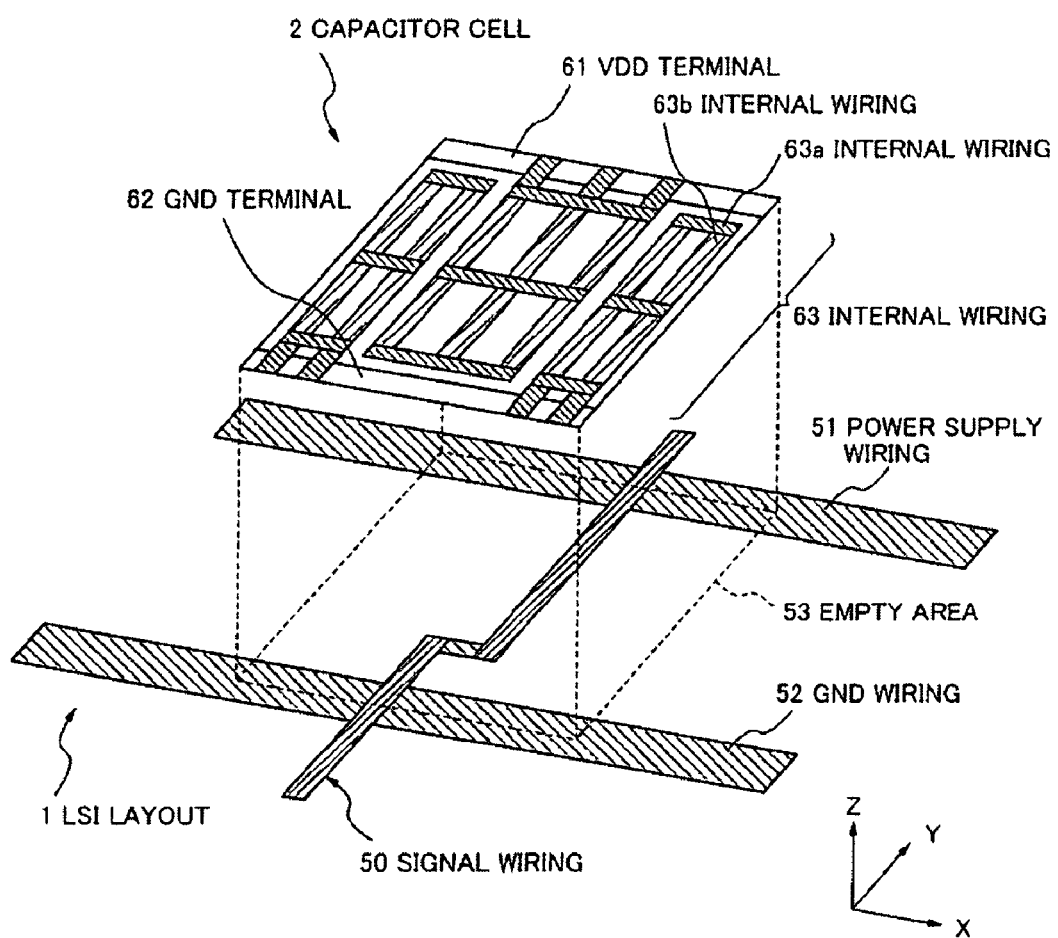
FIG. 15 is a conceptual diagram showing an example of arranging a capacitor cell in an empty area.

In Step S103, when empty area 53 is searched for (YES at Step S104), the temporary arrangement unit 102 performs temporary arrangement of the selected capacitor cell 2 as shown in FIG. 15 (Step S105).

The DRC unit 103 performs DRC with reference to the LSI layout information 201 and the physical library information 204 to investigate whether internal wiring 63 of the capacitor cell 2 for which temporary arrangement has been performed does not make contact with or causes a minimum interval violation to a signal line 50 (Step S106). In DRC of Step S106, when a DRC error is not detected (NO at Step S107), the correction unit 104 arranges the temporarily arranged capacitor cell 2 in the empty area 53 and changes the layout of the LSI (Step S108).

Figure 16:
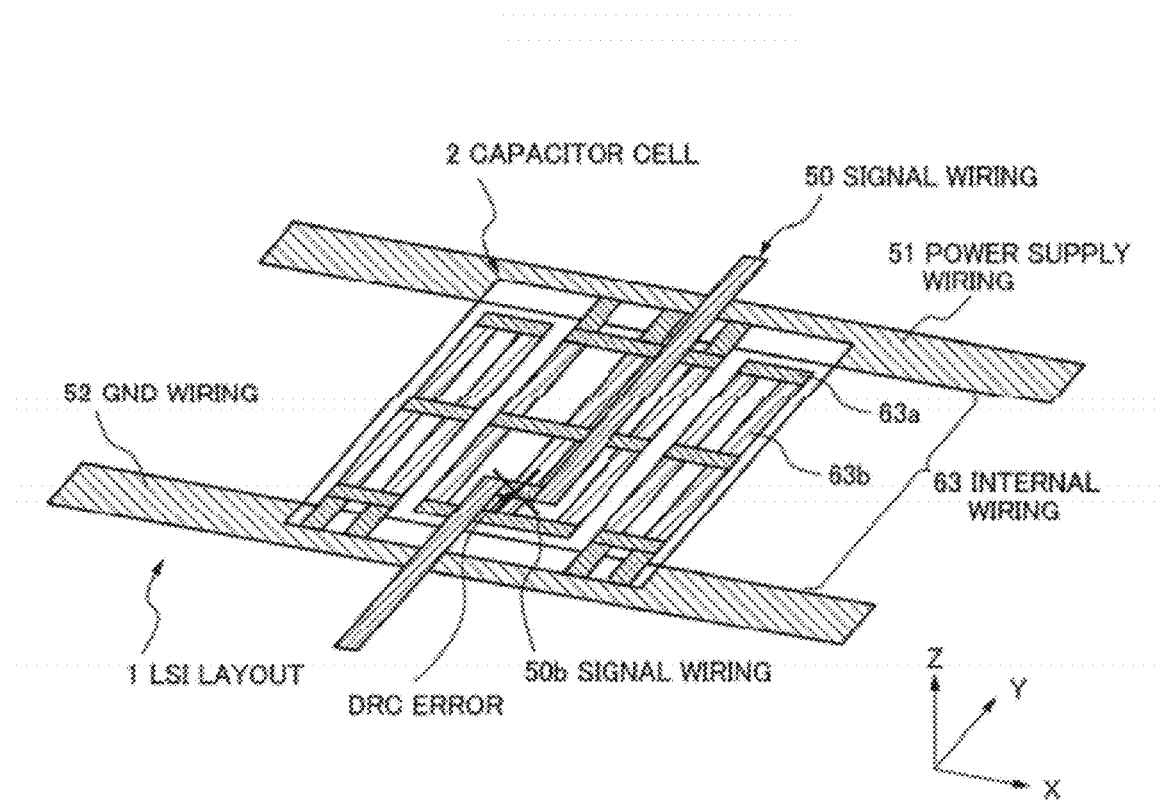
FIG. 16 is a conceptual diagram showing an example of a DRC error.

On the other hand, in DRC of Step S106, when a DRC error is detected, the DRC unit 103 determines whether an internal wiring causing the DRC error can be eliminated or not (Steps S109 and S110) Here, an example of a DRC error will be described. With reference to FIG. 14, the signal line 50 in the empty area 53 includes a signal line 50b provided in the same layer (XY plane) as a VDD wiring 51 and a GND wiring 52 and a signal line 50a provided in an upper layer (in the Z axial) of the VDD wiring 51 and the GND wiring 52. The signal line 50a and the signal line 50b are connected by a via which is not illustrated. With reference to FIG. 16, the internal wiring 63 of the capacitor cell 2 for which temporary arrangement has been performed is in the same layer (XY plane) as the VDD wiring 51, the GND wiring 52 and the signal line 50b. For this reason, in the example of temporary arrangement shown in FIG. 16, because internal wiring 63b is short-circuited to the signal line 50b, the DRC unit 103 detects the short portion as a DRC error portion.

When a DRC error is detected (YES at Step S107), the DRC unit 103 determines whether elimination of the internal wiring having the portion of occurrence of the DRC error (a short portion, for example) is possible or not (Step S109). At that time, the DRC unit 103 refers to the physical library information 204 to determine whether the internal wiring 63 detected as having a DRC error can be eliminated. In an example shown in FIG. 16, because a DRC error portion is internal wiring 63b set so that it can be eliminated, a determination is made that elimination is possible (YES at Step S109).

When a determination is made that a DRC error portion can be eliminated, the DRC unit 103 counts the number of internal wiring 63bs having a DRC error portion, and determines whether the number satisfies the upper limit number of eliminated wirings specified in the capacitor cell information 203 (Step S110). In the example shown in FIG. 16, one among internal wiring 63bs that are connected to the VDD terminal 61 in capacitor cell 2 (C1) for which temporary arrangement has been performed short-circuits to the signal line 50b. Referring to the capacitor cell information 203 shown in FIG. 7, the upper limit number of possible eliminated wires in capacitor cell 2 (C1) is two on the VDD terminal 61 side. The DRC unit 103 decides to eliminate the internal wiring 63b having a DRC error, because the number of internal wiring 63bs having a DRC error portion (i.e., "1") is smaller than the upper limit number of possible eliminated wirings (i.e., "2"). In this case, the DRC unit 103 outputs information which designates internal wiring 63bs to be eliminated and the number of wirings to be eliminated as the DRC result 207.

On the other hand, in processing of Steps S109 or S110, when being determined that an internal wiring having a DRC error cannot be eliminated, the temporary arrangement unit 102 searches other areas of the LSI and searches for another empty area 53 in which the capacitor cell 2 can be arranged (Step S103).

Figure 17:
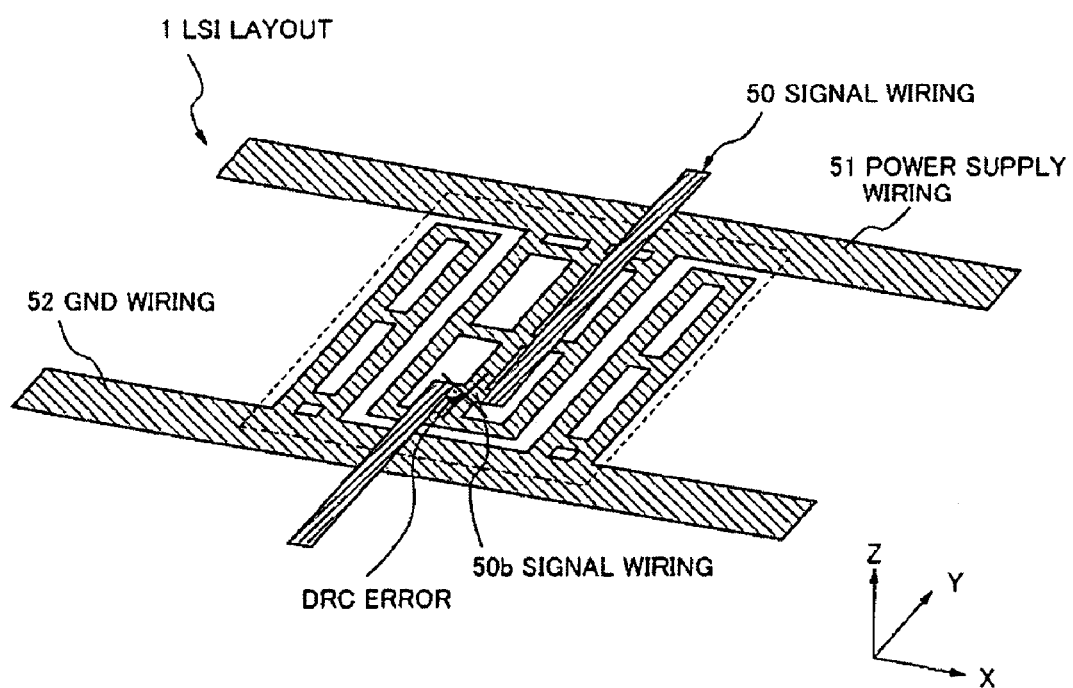
FIG. 17 is a conceptual diagram showing an example of integration of an internal wiring to a LSI wiring.

In processing of Steps S109 and S110, when elimination of internal wiring 63b is determined, the correction unit 104 integrates (merges) the internal wiring 63 of capacitor cell 2 for which temporary arrangement has been performed into the LSI wiring 1 as shown in FIG. 17 and updates the LSI layout information 201 (Step S111). For example, the correction unit 104 updates the LSI layout information 201 by replicating the internal wiring 63 as the VDD wiring 51 and the GND wiring 52 in the LSI and adding them to the LSI wiring 1. As a result, the internal wiring 63 will be the part of the VDD wiring 51 or the GND wiring 52.

Figure 18:
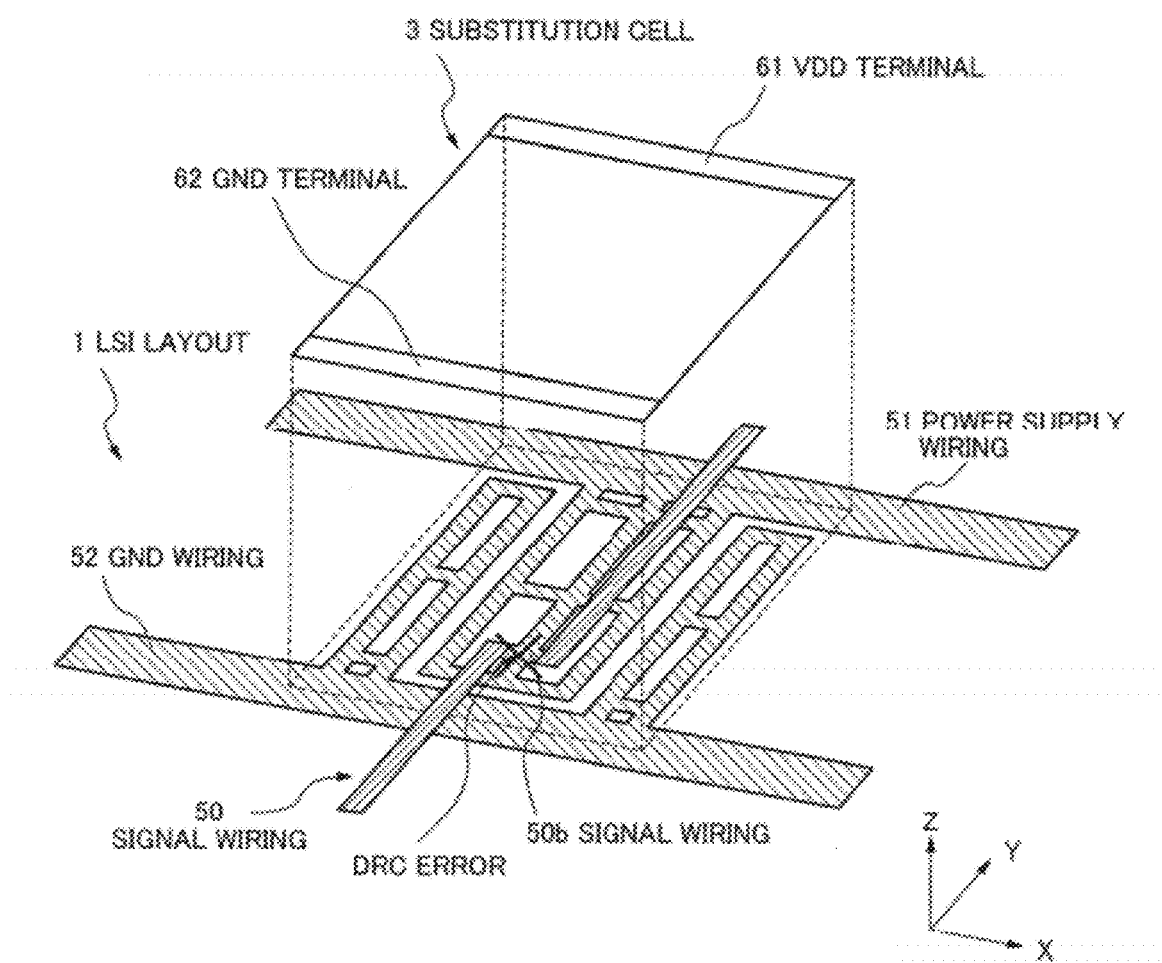
FIG. 18 is a conceptual diagram showing an example of arranging a substitution cell.

When the LSI layout information 201 is updated by integration of the internal wiring 63, the correction unit 104 arranges substitution cell 3 corresponding to the capacitor cell 2 for which temporary arrangement has been performed replacing the capacitor cell 2 concerned, as shown in FIG. 18 (Step S112). In that time, the substitution cell 3 is arranged on the area (empty area 53) where the internal wiring 63 integrated in processing of Step S111 is placed.

Figure 19:
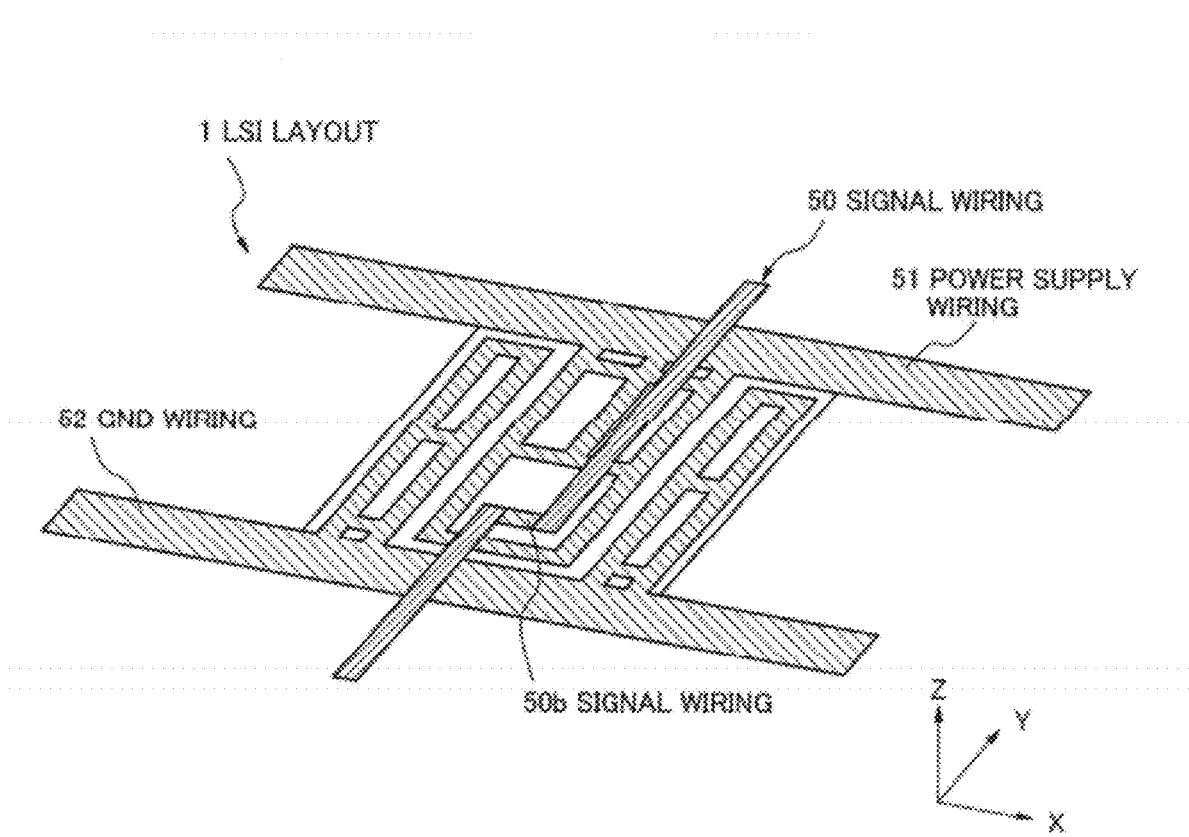
FIG. 19 is a conceptual diagram showing an example of a LSI wiring after layout correction to which capacitance is added.

After the substitution cell 3 is arranged, the correction unit 104 eliminates the internal wiring 63s having a DRC error from the LSI wiring 1 into which the internal wiring 63 has been integrated and updates the LSI layout information 201 (Step S113). For example, as shown in FIG. 19, an element corresponding to the internal wiring 63 in which a DRC error portion has been detected is eliminated from the VDD wiring 51 and the GND wiring 52 in the LSI wiring 1 corrected in Step S111.

When the LSI layout information 201 is updated in Step S108 or Step S113, the capacitance determination unit 105 adds a capacitance value in the empty area 53 to which the capacitor cell 2 or substitution cell 3 has been arranged (Step S114). An added capacitance value is determined by a layout corrected by repeating processing of Steps S101 to S115. When capacitor cell 2 is arranged in Step S108, a capacitance value of the capacitor cell 2 is added. For example, when capacitor cell 2 (C1) is arranged, a capacitance value added will be 40 [pF] as shown in FIG. 7, because the number of eliminated wiring elements is 0. Similarly, when capacitor cell 2 (C2) is arranged, 30 [pF] is added. When substitution cell 3 is arranged in Step S112, a capacitance value which is added is decided according to the number of wirings eliminated in Step S113. For example, when substitution cell 3 (D1) is arranged, and one wiring element is eliminated in Step S113, a capacitance value added will be 38 [pF] as shown in FIG. 7. Similarly, when substitution cell 3 (D2) is arranged, and two wirings are eliminated, 26 [pF] is added.

Further, in this example, although a capacitance value added in Step S114 is obtained according to arranged substitution cell 3 and the number of wiring elements corresponding to eliminated internal wiring 63*bs* in a cell, the second exemplary embodiment is not limited to this. As it has been mentioned above, wiring capacitance in capacitor cell 2 is determined by width and length of its wiring uniquely. For this reason, an added capacitance value may be calculated by the following formula. Namely, added capacitance value=(capacitance value of capacitor cell 2 when supposing the number of eliminated elements is 0)−((the total area of wiring elements corresponding to eliminated internal wiring 63*bs*)×(a wiring capacitance value per unit area)), where the wiring capacitance value per unit area is acquired from the physical library information 204 as constant value.

The capacitance determination unit 105 determines whether an additional capacitance value fills a total capacitance value required for noise reduction in the LSI by comparing the capacitance value 205 calculated in advance and a total capacitance value (an additional capacitance value) calculated in Step S114 (Step S115) In Step S115, when an additional capacitance value is less than the capacitance value 205, processing moves to Step S103, and another empty area is searched for. On the other hand, in Step S115, when an additional capacitance value is equal to or above the capacitance value 205, processing of capacity addition to a LSI is ended.

The design support apparatus 10 according to the second exemplary embodiment repeats processing of the above-mentioned Steps S101 to S115 until an added total capacitance value (additional capacitance value) exceeds a capacitance value (the capacitance value 205) required for noise reduction. As a result, capacitance required for noise reduction can be added to a LSI. According to the second exemplary embodiment, it is possible to avoid restrictions imposed by wiring which is already arranged in a LSI and add capacitance without preparing a large number of capacitor cells. For example, in related technologies, in order to avoid contact with signal wiring which is already arranged on a LSI, a capacitor cell of a plurality of kinds of layouts are needed to be prepared. According to the second exemplary embodiment, a lot of capacitor cells, layouts of which are varied according to an allocating place and design rules, do not need to be prepared, because a capacitor cell is arranged after a wiring which touches an existing signal line has been eliminated.

The design support apparatus 10 according to the second exemplary embodiment provides a plurality of capacitor cell 2*s*, the cell sizes (capacitance value) of which are varied, and searches for empty area 53 in which each of them can be arranged to arrange it. For this reason, provided capacitor cell 2 can be arranged in an empty area of a LSI without waste, and capacitance can be added to the LSI efficiently. Moreover, in the second exemplary embodiment, capacitor cell 2 is added while comparing an added total capacitance (additional capacitor) and a needed capacitance value (the capacitance value 205). As a result, capacitance required for reduction of noise in a LSI can be added.

The internal wiring 63*b* that can be eliminated and the number of wirings thereof are specified for each capacitor cell 2 according to the second exemplary embodiment. That is, the lowest value of a capacitance value according to the cell size of capacitor cell 2 or substitution cell 3 is set. For this reason, capacitance according to the cell size of added capacitor cell 2 or substitution cell 3 is secured. For example, when the number of wirings that can be eliminated is not set, even if capacitor cell 2 of a larger cell size is arranged, there is a risk that added capacitance is too small or that there is no added capacitance provided. In the second exemplary embodiment, although capacitor cell 2 or substitution cell 3 of a large size can be arranged because a lowest value of a capacitance value which can be added is set for each capacitor cell 2 or substitution cell 3, when an capacitance value to be added is small, capacitor cell 2 or substitution cell 3 of a smaller size can be arranged. For this reason, capacitance can be added to empty area 53 efficiently.

As mentioned above, according to the second exemplary embodiment, more capacitance can be inserted than the methods described in BACKGROUND ART, and thus design backtracking by lack of capacitance and increase of a chip size can be prevented. And without preparing many kinds of capacitor cells in advance, capacitance required for noise reduction can be added to a LSI.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

What is claimed is:

1. A design method of a semiconductor integrated circuit carried out by a computer, comprising:

a DRC step, performed by the computer, of performing a design rule check (DRC) with reference to layout information on an internal wiring in a capacitor cell and layout information on a signal wiring in said semiconductor integrated circuit, said DRC adapted to determine whether said capacitor cell can be laid out in an area of said semiconductor integrated circuit or not;

an integration step, performed by the computer, of integrating layout information on said internal wiring into layout information on said signal wiring when being determined in said DRC step that there is an error; and an elimination step, performed by the computer, of eliminating an error portion in said internal wiring from said integrated layout information, wherein said internal wiring is connected to a power supply terminal and a grounding (GND) terminal in said capacitor cell, wherein said method further comprises a step of preparing a substitution cell in which said internal wiring is eliminated from said capacitor cell, wherein said integration step comprises:

a step of performing temporary arrangement of said capacitor cell in said semiconductor integrated circuit;

a step of integrating layout information on internal wiring of said capacitor cell into layout information on a signal line in an area where temporary arrangement of said capacitor cell has been performed; and wherein said elimination step comprises:

a step of substituting said substitution cell for said capacitor cell for which temporary arrangement has been performed; and a step of eliminating layout information corresponding to said error portion from layout information on an area where said substitution cell has been arranged.

2. The design method of a semiconductor integrated circuit according to claim 1, further comprising:

a step of preparing cell information which specifies an internal wiring which can be eliminated in said capacitor cell; and a step of determining whether elimination of said error portion is possible or not with reference to said cell information, when being determined in said DRC step that there is an error.

3. The design method of a semiconductor integrated circuit according to claim 2, wherein a number of internal wirings that can be eliminated in said capacitor cell is specified in said cell information, and said number of internal wirings of said error portion that is eliminated is determined comparing a number of internal wirings determined that it can be eliminated in said determination of whether elimination is possible or not and a number of internal wirings which can be eliminated specified in said cell information.

4. The design method of a semiconductor integrated circuit according to claim 2, further comprising:

a step of arranging said capacitor cell in an area to which said DRC has been performed, when being determined in said DRC step that there is no error.

5. The design method of a semiconductor integrated circuit according to claim 2, comprising:

a step of adding a capacitance value added to said semiconductor integrated circuit; and a step of comparing said added capacitance value and a predetermined capacitance value set in advance, wherein capacitance is added to said semiconductor integrated circuit until said added capacitance value exceeds said predetermined capacitance value.

6. The design method of a semiconductor integrated circuit according to claim 1, further comprising:

a step of arranging said capacitor cell in an area to which said DRC has been performed, when being determined in said DRC step that there is no error.

7. The design method of a semiconductor integrated circuit according to claim 1, comprising:

a step of adding a capacitance value added to said semiconductor integrated circuit; and a step of comparing said added capacitance value and a predetermined capacitance value set in advance, wherein capacitance is added to said semiconductor integrated circuit until said added capacitance value exceeds said predetermined capacitance value.

8. A non-transitory recording medium in which a design program which makes a computer execute the design method of a semiconductor integrated circuit described in claim 1 is recorded.

9. A design support apparatus of a semiconductor integrated circuit, comprising:

a DRC unit that performs a design rule check (DRC) with reference to layout information on an internal wiring in a capacitor cell and layout information on a signal wiring in a semiconductor integrated circuit of a design object; said DRC adapted to determine whether said capacitor cell can be laid out in an area of said semiconductor integrated circuit or not; and a correction unit that integrates layout information on said internal wiring into layout information on said signal wiring when said DRC unit determines that there is an error, wherein said correction unit eliminates an error portion in said internal wiring from said integrated layout information, wherein said internal wiring is connected to a power supply terminal and a grounding(GND) terminal in said capacitor cell, wherein said apparatus further comprises:

a storage unit which stores layout information on a substitution cell in which said internal wiring is eliminated from said capacitor cell; and a temporary arrangement unit which performs temporary arrangement of said capacitor cell in said semiconductor integrated circuit, wherein said correction unit comprises:

a layout correction section which integrates layout information on an internal wiring of said capacitor cell into layout information on a signal line in an area where temporary arrangement of said capacitor cell has been performed; and a substitution cell arrangement section that substitutes said substitution cell for said capacitor cell for which temporary arrangement has been performed, and wherein said layout correction section eliminates layout information corresponding to said error portion from layout information on an area where said substitution cell has been arranged.

10. The design support apparatus of a semiconductor integrated circuit according to claim 9, further comprising:

a memory storage in which cell information which specifies an internal wiring which can be eliminated in said capacitor cell is recorded; and an eliminability determination section which determines whether elimination of said error portion is possible or not with reference to said cell information, when being determined by said DRC unit that there is an error.

11. The design support apparatus of a semiconductor integrated circuit according to claim 10, wherein a number of internal wirings that can be eliminated in said capacitor cell is specified in said cell information, and wherein the apparatus further comprises a number-of-wirings-to-be-eliminated determination section which determines a number of internal wirings of said error portion that are eliminated comparing a number of internal wirings determined that it can be eliminated in said determination of whether elimination is possible or not and a number of internal wirings which can be eliminated specified in said cell information.

12. A design support apparatus of a semiconductor integrated circuit according to claim 10, further comprising:

a capacitor cell arrangement section which arranges said capacitor cell in an area to which said DRC unit has been performed, when said DRC unit determines there is no error.

13. A design support apparatus of a semiconductor integrated circuit according to claim 10, further comprising:

a capacitance determination unit which adds a capacitance value added to said semiconductor integrated circuit and compares said added capacitance value and a predetermined capacitance value set in advance, wherein said correction unit adds capacitance to said semiconductor integrated circuit until said added capacitance value exceeds said predetermined capacitance value.

14. A design support apparatus of a semiconductor integrated circuit according to claim 9, further comprising:

a capacitor cell arrangement section which arranges said capacitor cell in an area to which said DRC unit has been performed, when said DRC unit determines there is no error.

15. A design support apparatus of a semiconductor integrated circuit according to claim 9, further comprising:
a capacitance determination unit which adds a capacitance value added to said semiconductor integrated circuit and compares said added capacitance value and a predetermined capacitance value set in advance,
wherein said correction unit adds capacitance to said semiconductor integrated circuit until said added capacitance value exceeds said predetermined capacitance value.

* * * * *